United States Patent [19]

Maeno et al.

[11] Patent Number: 5,047,714
[45] Date of Patent: Sep. 10, 1991

[54] PRINTED CIRCUIT BOARD AND A METHOD OF RECOGNIZING THE POSITION OF SURFACE MOUNTED PARTS

[75] Inventors: Yutaka Maeno, Yotsukaido; Seiji Hashiguchi, Narashino; Keiichi Hasegawa, Yotsukaido; Masaaki Hachiya, Narashino; Shingo Ueyama, Yokohama, all of Japan

[73] Assignee: Hitachi, Ltd., Tokyo, Japan

[21] Appl. No.: 349,655

[22] Filed: May 10, 1989

[30] Foreign Application Priority Data

May 11, 1988 [JP] Japan .................. 63-112403

[51] Int. Cl.⁵ .................. G01R 31/00; G01R 1/06
[52] U.S. Cl. .................. 324/158 R; 324/73.1; 324/158 F
[58] Field of Search .......... 324/158 R, 158 D, 158 F, 324/73 PC; 382/8; 358/101; 356/400, 401, 548; 29/834-837, 840; 361/400, 401

[56] References Cited

U.S. PATENT DOCUMENTS

| | | | |
|---|---|---|---|
| 3,335,327 | 8/1967 | Damon et al. .................. | 324/158 F |
| 3,441,853 | 4/1969 | Bodine .................. | 324/158 F |
| 4,362,991 | 12/1982 | Carbine .................. | 324/158 F |
| 4,600,309 | 7/1986 | Fay .................. | 356/400 |
| 4,626,907 | 12/1986 | Schedewie .................. | 358/101 |
| 4,628,464 | 12/1986 | McConnell .................. | 358/101 |
| 4,631,820 | 12/1986 | Harada et al. .................. | 29/840 |
| 4,681,421 | 7/1987 | Yamada et al. .................. | 324/73 PC |
| 4,737,845 | 4/1988 | Susuki et al. .................. | 358/101 |
| 4,761,881 | 8/1988 | Bura et al. .................. | 361/400 |
| 4,822,988 | 4/1989 | Gloton .................. | 361/401 |
| 4,826,441 | 5/1989 | Palmer, III .................. | 324/73 PC |

Primary Examiner—Kenneth A. Wieder
Assistant Examiner—Vinh P. Nguyen
Attorney, Agent, or Firm—Fay, Sharpe, Beall, Fagan, Minnich & McKee

[57] ABSTRACT

A printed circuit board is provided on its surface with position detecting patterns at specific positions with respect to conductor patterns for connecting the leads of an integrated circuit. The position of the lead connecting conductor patterns is obtained an indirect manner through a calculation based on the positional information of the position detecting patterns.

20 Claims, 6 Drawing Sheets

PRINTED CIRCUIT BOARD AND A METHOD OF RECOGNIZING THE POSITION OF SURFACE MOUNTED PARTS

BACKGROUND OF THE INVENTION

1. Field of the Invention

The present invention relates to a printed circuit board suitable for mounting so-called surface-mounted parts such as flat pack ICs (will be termed simply FICs hereinafter), and a method of recognizing the position of a surface-mounted part on the printed circuit board.

2. Description of the Prior Art

FIC leads have a width of about 300 $\mu$m and a lead spacing of about 350 $\mu$m. The number of leads is more than one hundred in some cases, and it is not easy to position, through a visual maneuver, an FIC on a printed circuit board so that all of its leads are placed on the respective conductor patterns on the board.

To cope with this matter, there has been proposed, in U.S. Pat. No. 4,737,845, the detection of the position and direction of conductor patterns by imaging the conductor patterns using an imaging tube. However, because of the presence of soldering paste applied to the conductor patterns, the conductor patterns do not always provide a sufficient amount of light reflection, and therefore the imaging tube does not always produce data enough to detect the position and direction of the conductor patterns.

SUMMARY OF THE INVENTION

An object of the present invention is to provide a printed circuit board which ensures the detection of the position and direction of conductor patterns.

Another object of the present invention is to provide a method of recognizing the position of a surface-mounted part on the printed circuit board, capable of surely detecting the position and direction of conductor patterns.

The above objectives are achieved by the arrangement of a printed circuit board as follows.

The printed circuit board has on its surface at least a pair of parallel rows of conductor patterns for connecting the leads of an integrated circuit, and there are provided position detecting patterns at specific positions with respect to at least two of the lead connecting conductor patterns and on lines at right angles with the rows.

Through the above-mentioned arrangement of the printed circuit board, the position detecting patterns are located at specific positions at right angles with the row of lead connecting conductor patterns, and by recognizing the position of the position detecting patterns with such a visual means as an imaging tube, the position and direction of the lead connecting conductor patterns can be recognized accurately as if the lead connecting conductor patterns are detected directly.

The method of recognizing the position of a surface-mounted part on the printed circuit board is as follows.

The method includes a step of supporting a printed circuit board, a step of detecting positional information of detecting patterns located at specific positions with respect to at least two lead connecting conductor patterns of a row of conductor patterns and on a line at right angles with respect to the row, and a step of calculating arithmetically the position and direction of the lead connecting conductor patterns from the positional information.

The lead connecting conductor patterns have an application of solder and soldering paste for connecting a surface-mounted part, while the position detecting patterns do not need the application of solder and paste and therefore provide a sufficient light reflection which enables accurate distinction from the circuit board. This allows an artificial visual means to provide reliable data on the position detecting patterns.

In consequence, the method of recognizing the position of a surface-mounted part on the printed circuit board, which bases the operation on the detection of position detecting patterns, is capable of recognizing the lead connecting conductor patterns in an indirect manner with high accuracy.

DESCRIPTION OF THE PREFERRED EMBODIMENTS

The illustrated embodiments of the present invention will be described in the following.

Figure 1:
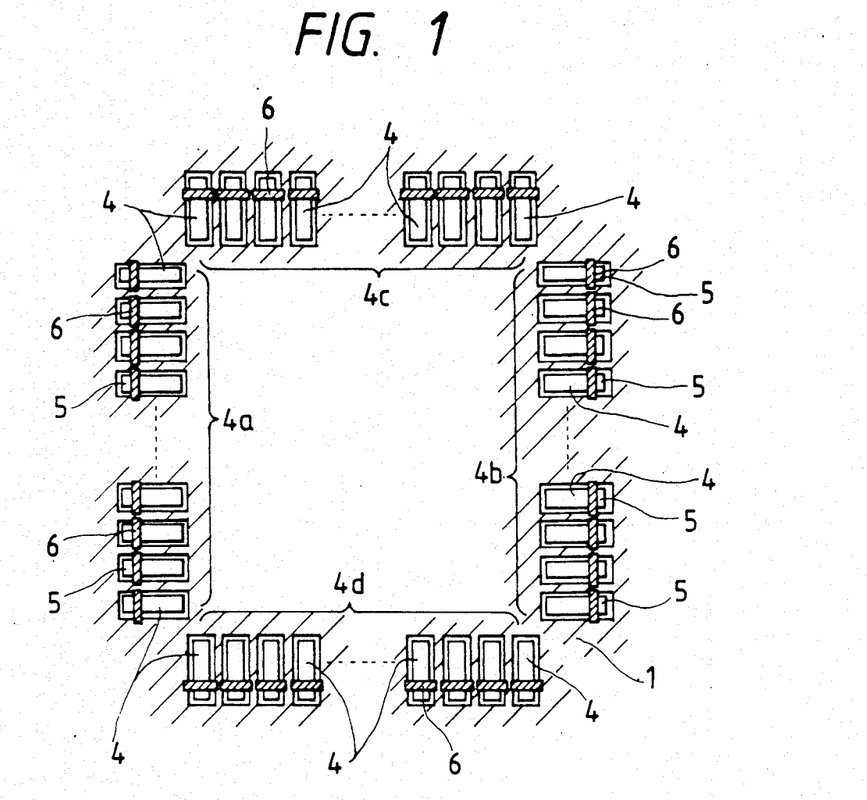
FIG. 1 is a plan view showing the principal portion of the printed circuit board embodying the present invention.
Figure 2:
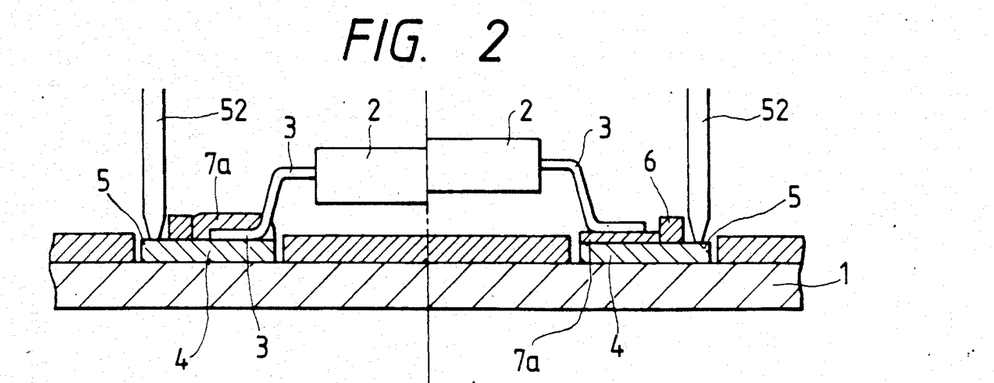
FIG. 2 is a cross-sectional view of the printed circuit board before an FIC is soldered.

FIG. 1 is an overall view of a printed circuit board 1, which has the formation of many lead connecting conductor patterns 4 for connecting leads 3 of an FIC, as shown in FIG. 2. The lead connecting conductor patterns 4 are aligned in at least a pair of rows parallel to each other (the embodiment of FIG. 1 comprises two pairs of rows including a pair 4a and 4b and another pair 4c and 4d). The rows 4a and 4b are parallel and the rows 4c and 4d are parallel. The row pair 4a and 4b and the row pair 4c and 4d are at right angles with each other. Formed by the lead connecting conductor patterns 4 and along lines at right angles with respect to the rows of conductor patterns are position detecting patterns 5.

Although in the embodiment of FIG. 2 the lead connecting conductor patterns 4 and position detecting patterns 5 are formed of unitary conductors by the print technique, they are separated by solder resists 6 that are fixed on the patterns. The solder resists 6 can be formed also by the print technique.

As shown, in the right half of FIG. 2 for the state of the lead connecting conductor pattern 4 before the lead 3 of FIC 2 is soldered to it, a solder layer 7a is formed on the conductor pattern 4. The position detecting pattern 5 is not provided with a solder layer, and the pattern surface is exposed to the atmosphere. Shown in the left half of FIG. 2 is the state of the lead connecting conductor pattern 4 after the lead 3 of FIG. 2 is soldered. Melted and subsequently solidified solder 7b electrically connects the lead 3 to the lead connecting conductor pattern 4 electrically.

Figure 9:
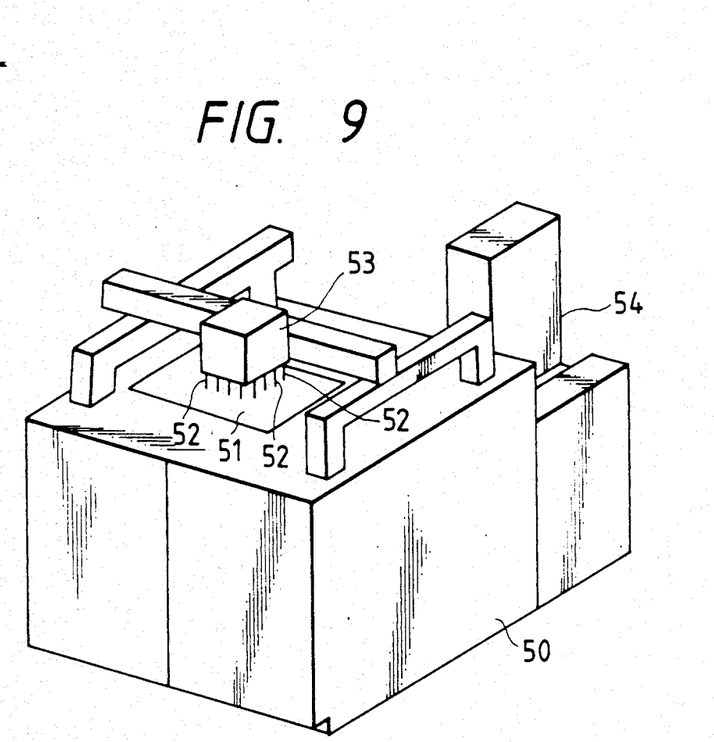
FIG. 9 is a perspective view showing the printed circuit board inspection system.

It will be appreciated from the left half of FIG. 2 that the solder resist 6 which separates the position detecting pattern 5 from the lead connecting conductor pattern 4 serves as a stopper for retarding the melted solder layer 7b on the lead connecting conductor pattern 4 from flowing onto the position detecting pattern 5. As a result, a sufficient amount of solder is retained on the lead connecting conductor pattern 4 for making the electrical connection at the same time the surface of the position detecting pattern 5 remains free from solder. This condition is advantageous for the electrical inspection of the packaged printed circuit board using position detecting probes 52, because the pattern provides a flat surface having a constant height, which allows a satisfactory contact between the probes 52 and position detecting patterns. FIG. 9 will be explained later.

Figure 3:
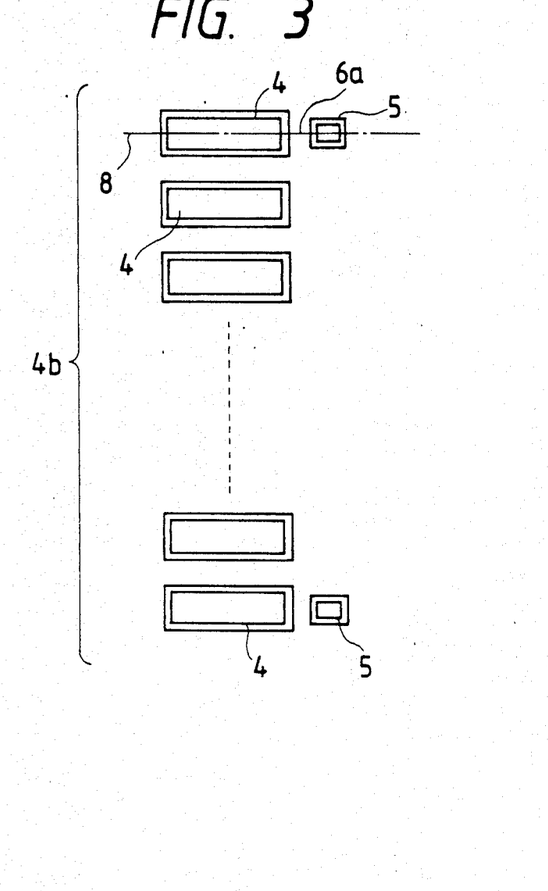
FIG. 3 is a plan view showing the principal portion of the printed circuit board according to another embodiment of the invention.
Figure 4:
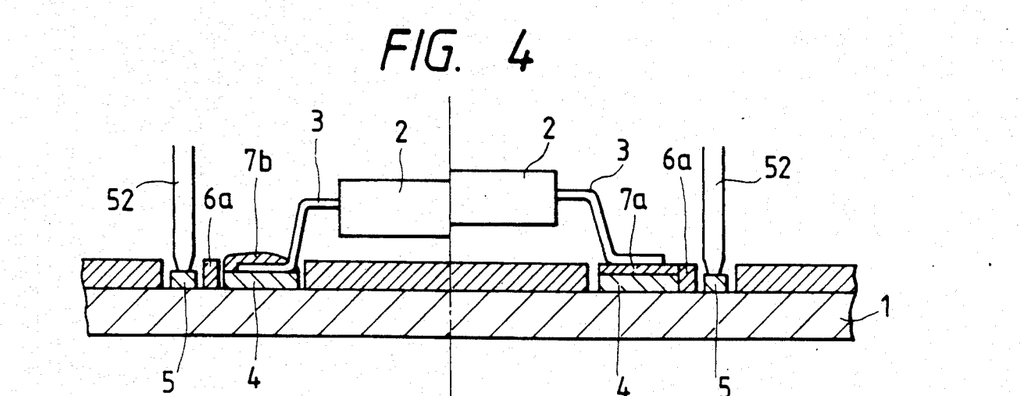
FIG. 4 is a cross-sectional view of the printed circuit board before an FIC is soldered.

FIGS. 3 and 4 show another embodiment of this invention. Shown in FIG. 3 are only lead connecting conductor patterns 4 and associated position detecting patterns 5 on one row 4b. FIG. 4 shows on the right half the state before the leads 3 of FIG. 2 are soldered to the lead connecting conductor patterns 4, and shows on the left half the state after soldering. It is clearly shown in these figures that the lead connecting conductor patterns 4 and the associated position detecting pattern 5 are isolated electrically from each other. This prevents solder 7a on the lead connecting conductor pattern 4 from flowing onto the position detecting pattern 5, and a space 6a provided between the lead connecting conductor pattern 4 and position detecting pattern 5 serves as a means of retarding melted solder from flowing onto the position detecting pattern 5. The effectiveness of the retarding means is further enhanced when solder resist is placed in the space 6a.

As will be appreciated from FIG. 3, the position detecting pattern 5 is located on the center line 8 that extends in the longitudinal direction . The position detecting pattern 5 has a dimension in its width direction (row direction) made smaller than the counterpart of the lead connecting conductor pattern 4. This enables an artificial visual means to detect the position of the position detecting pattern 5 which is narrower in width than the lead connecting conductor pattern 4. Since the position detecting pattern 5 is located on the center line of the lead connecting conductor pattern 4 seen in the width direction, the position of the lead connecting conductor pattern 4 can be detected accurately in an indirect manner.

In the embodiment of FIG. 3, the position detecting patterns are provided at only both extremes of a row of lead connecting conductor patterns. Generally speaking, it is not necessary to provide position detecting patterns for all lead connecting conductor patterns, but the provision of at least two position detecting patterns for each row suffices for the purpose. Position detecting patterns are preferably located at symmetrical positions with respect to the center of each row.

Figure 5:
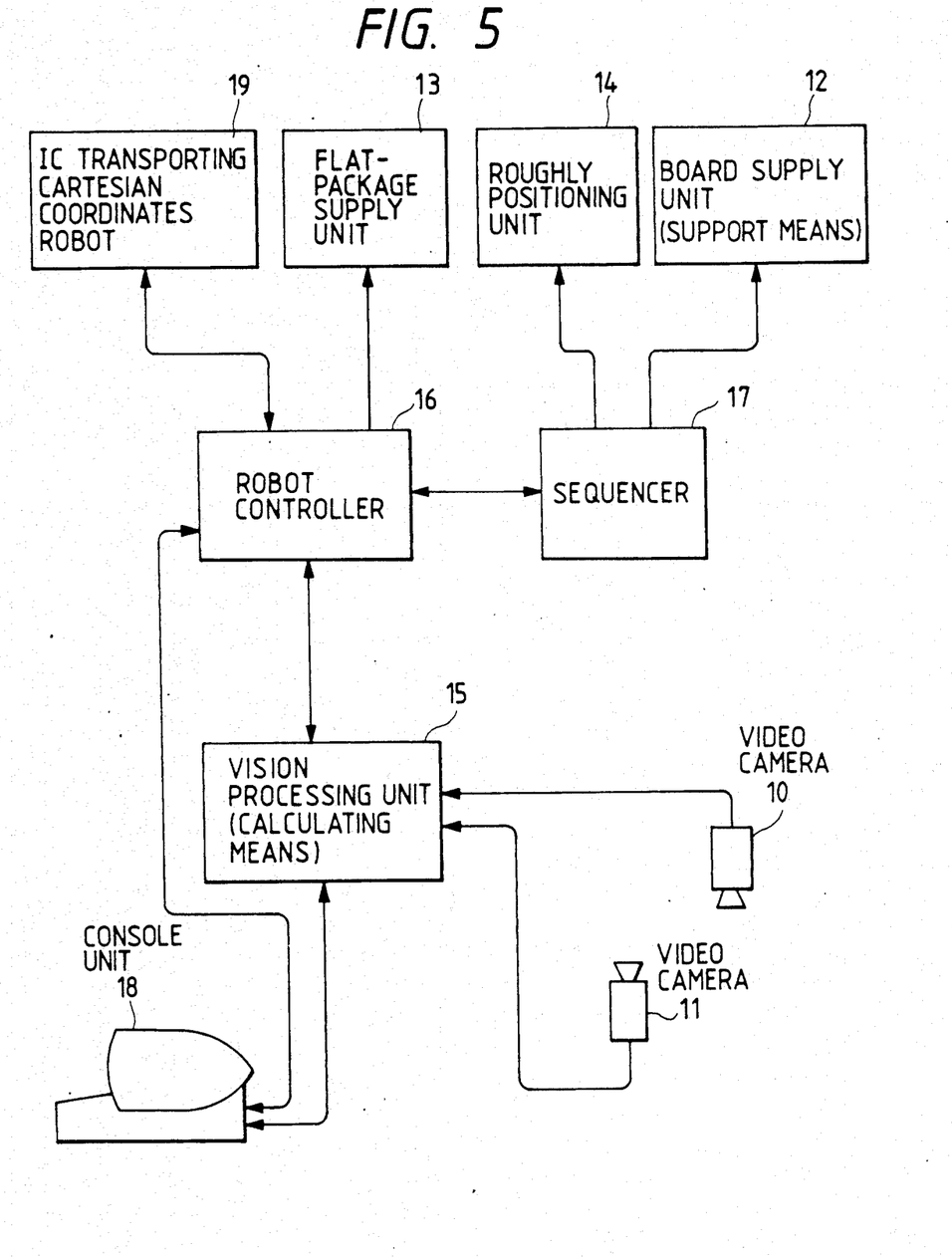
FIG. 5 is a block diagram showing an embodiment of the inventive position recognition system.

FIG. 5 shows the arrangement of an automatic part mounting apparatus which mounts FICs on the printed circuit board 1 (the apparatus is equipped with the part position recognition system). The automatic part mounting apparatus comprises two video cameras 10 and 11, an IC transporting Cartesian coordinates robot 19, a board supply unit 12 which also serves as a board support means, a flat-package supply unit 13, a roughly positioning unit 14, a vision processing unit 15 including computation means, a robot controller 16, a sequencer 17, and a console unit 18.

The sequencer 17 is the center of control, implementing a sequential process in accordance with the predetermined sequence program. The robot controller 16, board supply unit 12 and roughly positioning unit 14 base their operations on the instructions issued by the sequencer 17. The sequencer 17 receives signals from the robot controller 16 to determine its operation.

The robot controller 16 controls the IC transporting Cartesian coordinates robot 19 and flat-package supply unit 13. The vision process unit 15 receives the image signal from the video cameras 10 and 11, and implements the pattern processing for the printed circuit board 1 and FIG. 2 thereby to get information for the positioning of the printed circuit board 1, the positioning of the FIC and the positioning for mounting. The resulting information is sent to the robot controller 16, so that the IC transporting Cartesian coordinates robot 19 and supply unit 12 are controlled, and the board supply unit 12 is controlled by the sequencer 17. The video camera 10 is a camera for taking the image of the suction grasp for handling the FIC and the image of the board.

The video camera 11 is to detect the position of FIC the. The console unit 18 includes a keyboard and CRT monitor, and the operator makes access to the vision process unit 15 and robot controller 16 through the console.

The board supply unit 12 feeds a printed circuit board 1 to the part mount position. The flat-package supply unit 13 supplies an FIC from the FIC storage to the position where the robot hand takes the part. The roughly positioning unit 14 performs rough positioning for the FIC.

Figure 6:
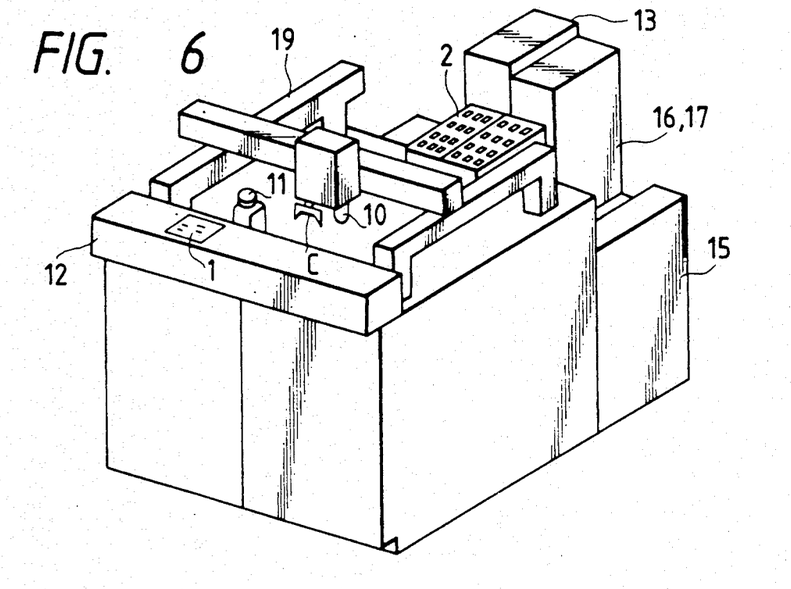
FIG. 6 is a perspective view showing an embodiment of the position recognition system.

FIG. 6 shows the external view of the mounting apparatus, which includes the Cartesian coordinates robot 19, board supply unit 12, flat-package supply unit 13, vision process unit 15, robot controller 16 and sequencer 17, all of which are placed on a common base.

Figure 7A:
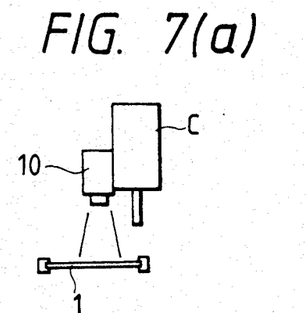
FIG. 7 is a diagram used to explain the operation of the position recognition system.
Figure 7B:
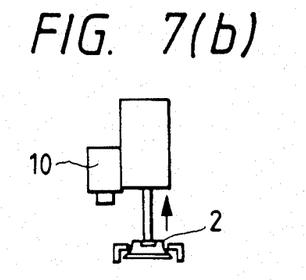
Figure 7C:
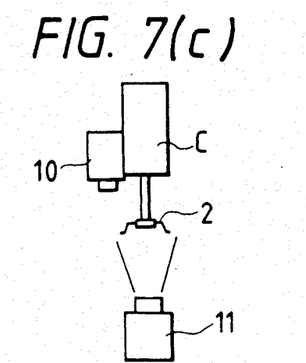
Figure 7D:
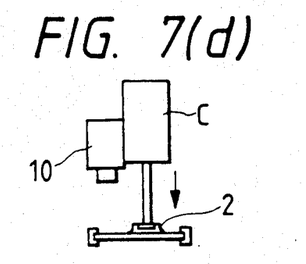
Figure 8:
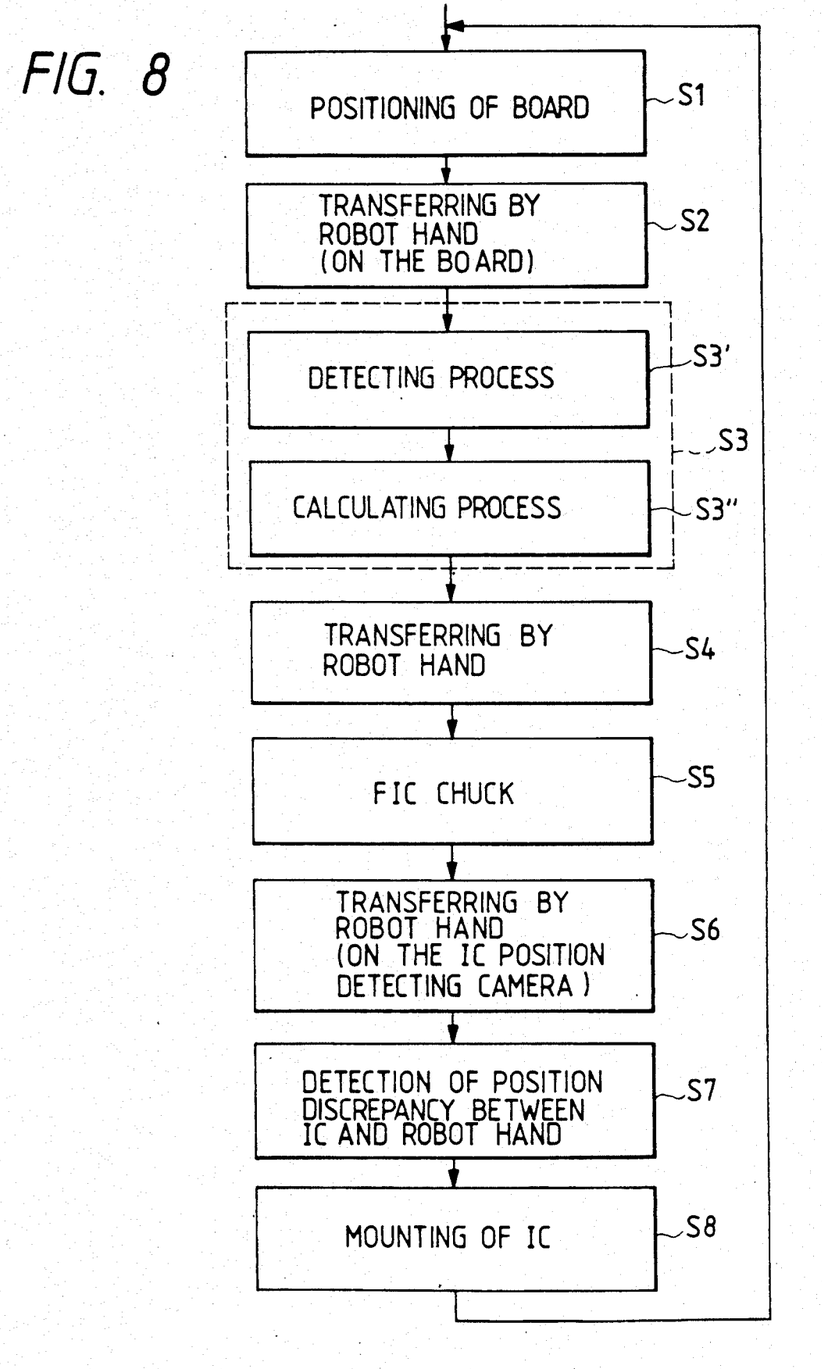
FIG. 8 is a flowchart used to explain the inventive position recognition method.

The robot may be a horizontal articulated type which meets required positioning accuracy, and is equipped a hand having a suction grasp for handling the FIC and a video camera for taking the image of the board. Another video camera 11 for detecting the position of the FIC is fixed on the base to sight upwardly Next, the basic operation of the foregoing part mounting apparatus will be explained in connection with FIG. 7. The operational sequence is shown in FIG. 8.

(a) With a printed circuit board 1 being fixed mechanically on the board supply unit 12:(S1), the video camera 10 fitted on the robot hand C is moved to the position over the printed circuit board 1:(S2), and the accurate position of the lead connecting conductor pattern 4 on the printed circuit board 1 for mounting the FIC is measured:(S3). In measuring the position, the video camera 10 images the position detecting patterns 5 and produces positional information. These are the steps of detection.

Next, steps of computation are carried out based on the positional information to determine the position and direction of the lead connecting conductor patterns. The algorithm of computation may be exactly the same as the one disclosed in U.S. Pat. No. 4,737,845, for example. In the case where position detecting patterns are formed only at both extremes of the lead connecting conductor patterns as shown in FIG. 3, the mean value of coordinates of these position detecting patterns are calculated.

(b) The robot hand C is moved to the FIC by the roughly positioning unit 14: (S4) to pick up by suction the FIC 2:(S5). In case the robot hand is equipped with the roughly positioning function, it can pick up the FIC directly from the FIC supply unit.

(c) With the FIC 2 being moved to a position over the video camera 11:(S6) for FIC position detection, the positional deviation of the FIC 2 from the robot hand C is detected:(S7).

(d) The positions of the lead connecting conductor patterns and FIC calculated by the visual process unit 15 are fed back to the robot by way of the robot controller 16 so that the FIC is placed by being positioned correctly on the lead connecting conductor patterns 4:(S8).

FIG. 9 shows an example of apparatus an for inspecting surface-mounted parts on a printed circuit board. The apparatus indicated generally by 50 comprises a support means 51 for holding a printed circuit board 1, a plurality of probes 52, a moving means 53 which brings the probes 52 in contact with the position detecting patterns 5 on the board and separates the probes 52 off of the patterns, and an electrical detection means 54 which surveys the electrical continuity among the probes.

Although the probes 52 are exaggerated in size relative to the printed circuit board 1 in FIG. 9, they are designed to come in contact with the surface of the position detecting patterns 5 of the board on which the FICs are already mounted, as shown in detail in FIGS. 2 and 4. Accordingly, the position detecting patterns 5 are formed on the exterior sides of the lead connecting conductor patterns 4 in this case.

The moving means indicated generally by 53 is designed to move the probes 52 in the horizontal and vertical directions in accordance with the taught-in program.

The electrical detection means is designed such that a specified voltage is applied between two particular probes and the current and voltage on the remaining probes are measured thereby to inspect the completed printed circuit board, with FICs being mounted, depending on whether or not the measured values meet the expected values.

We claim:

1. A printed circuit board comprising: at least a pair of parallel rows of conductor patterns for connecting leads of an integrated circuit; a position detecting pattern for detecting at least a position of one of said lead connecting conductor patterns formed at a specific position in a direction perpendicular to said rows and adjacent to said one of said lead connecting conductor patterns; and means for preventing flow of melted solder from said one of said lead connecting conductor patterns to said position detecting pattern.

2. A printed circuit board according to claim 1, wherein said position detecting pattern has a width narrower than the width of said one of said lead connecting conductor patterns.

3. A printed circuit board according to claim 1, wherein said position detecting pattern is formed of a conductor.

4. A printed circuit board according to claim 3, wherein said lead connecting conductor patterns are soldered, and said position detecting pattern is not soldered.

5. A printed circuit board according to claim 3, wherein said position detecting pattern and said one of said lead connecting conductor pattern is formed of a conductor.

6. A printed circuit board according to claim 1, wherein said position detecting pattern is disposed on the exterior side of said pair of rows of lead connecting conductor patterns.

7. A printed circuit board, comprising: at least a pair of parallel rows of conductor patterns for connecting leads of an integrated circuit, and a position detecting pattern for detecting at least a position of one of said lead connecting conductor patterns formed at a specific position in a direction perpendicular to said rows and adjacent to said one of said lead connecting conductor patterns, and means interleaved between said one of said lead connecting conductor patterns and said position detecting pattern, for preventing flow of melted solder.

8. A printed circuit board according to claim 7, wherein said melted solder flow preventing means is further for providing electrical isolation between said one of said lead connecting conductor patterns and said position detecting pattern.

9. A printed circuit board according to claim 7, wherein said melted solder flow preventing means comprises a stopper formed on the surface between each of said one of said lead connecting conductor patterns and said position detecting pattern, said position detecting pattern being electrically continuous with said one of said lead connecting conductor patterns.

10. A printed circuit board according to claim 9, wherein said stopper is formed of solder resist.

11. A printed circuit board having a surface, comprising:

a first row comprising a plurality of conductors for connecting leads of an integrated circuit, and corresponding first position detecting patterns each for detecting at least a position of one of said first row lead connecting conductors, and said first position detecting patterns being formed at predetermined positions along a longitudinal direction of said lead connecting conductor patterns adjacent at least both ends of said first row, said first row being formed in a direction perpendicular to said longitudinal direction of said lead connecting conductor patterns; and a second row comprising a plurality of conductors and corresponding second position detecting patterns each for detecting at least a position of one of said second row lead connecting conductors, and said second position detecting patterns being formed on said surface of said printed circuit board arranged substantially similarly to said first row, said second row being spaced apart by a predetermined interval from said first row, and being positioned parallel or perpendicular thereto.

12. A printed circuit board according to claim 11, wherein each of said first and second position detecting patterns is a part of the corresponding lead connecting conductor pattern and further comprising: means between said each position detecting pattern and said corresponding lead connecting conductor pattern for preventing flow of melted solder from said lead connecting conductor to said position detecting pattern.

13. A printed circuit board according to claim 12, wherein said preventing means is a stopper.

14. A printed circuit board according to claim 12, wherein said preventing means comprises a solder resist.

15. A printed circuit board according to claim 11, wherein said first and second position detecting patterns are spaced apart by a predetermined interval from the corresponding lead connecting conductor patterns.

16. A printed circuit board, comprising:
a first row and a second row formed in one of parallel and perpendicular to one another, each of said first and second rows respectively extending in first and second row directions and comprising a plurality of pairs of conductors formed in a direction perpendicular to the corresponding first and second row directions, respectively, and each of said pairs of conductors comprising a conductor pattern for connecting a lead of an integrated circuit and a position detecting pattern for detecting the position of the lead connecting conductor pattern, and each said position detecting pattern being formed at a predetermined position adjacent and in a longitudinal direction of a corresponding said lead connecting conductor pattern.

17. A printed circuit board according to claim 16, wherein said position detecting pattern is a part of said lead connecting conductor pattern, and further comprising: means between said position detecting pattern and said lead connecting conductor pattern, for preventing flow of melted solder from said lead connecting conductor to said position detecting pattern.

18. A printed circuit board according to claim 17, wherein said preventing means is a stopper.

19. A printed circuit board according to claim 17, wherein said preventing means comprises a solder resist.

20. A printed circuit board according to claim 16, wherein said position detecting pattern is spaced apart by a predetermined interval from the corresponding lead connecting conductor pattern.

* * * * *